(12) United States Patent
Chava et al.

(10) Patent No.: US 12,400,966 B2
(45) Date of Patent: Aug. 26, 2025

(54) PACKAGE COMPRISING INTEGRATED DEVICES AND BRIDGE COUPLING TOP SIDES OF INTEGRATED DEVICES

(71) Applicant: QUALCOMM Incorporated, San Diego, CA (US)

(72) Inventors: Bharani Chava, San Diego, CA (US); Abinash Roy, San Diego, CA (US); Stanley Seungchul Song, San Diego, CA (US); Jonghae Kim, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 18/492,402

(22) Filed: Oct. 23, 2023

(65) Prior Publication Data

US 2024/0055356 A1 Feb. 15, 2024

Related U.S. Application Data

(63) Continuation of application No. 17/357,811, filed on Jun. 24, 2021, now Pat. No. 11,830,819.

(51) Int. Cl.
*H01L 23/538* (2006.01)
*H01L 23/00* (2006.01)
(Continued)

(52) U.S. Cl.
CPC .......... *H01L 23/5385* (2013.01); *H01L 24/16* (2013.01); *H01L 24/81* (2013.01);
(Continued)

(58) Field of Classification Search
CPC ...... H01L 23/5385; H01L 24/16; H01L 24/81
See application file for complete search history.

(56) References Cited

U.S. PATENT DOCUMENTS

| 2010/0133704 A1 | 6/2010 | Marimuthu et al. |
| 2015/0001717 A1 | 1/2015 | Karhade et al. |

(Continued)

FOREIGN PATENT DOCUMENTS

| DE | 102020122699 A1 | 3/2021 |
| EP | 2731134 A1 | 5/2014 |

OTHER PUBLICATIONS

International Search Report and Written Opinion—PCT/US2022/030533—ISA/EPO—Oct. 11, 2022.

*Primary Examiner* — Errol V Fernandes
(74) *Attorney, Agent, or Firm* — Loza & Loza, LLP

(57) ABSTRACT

A package comprising a substrate; a first integrated device coupled to the substrate through at least a first plurality of solder interconnects; a second integrated device coupled to the substrate through at least a second plurality of solder interconnects; a first bridge coupled to the first integrated device and the second integrated device through at least a third plurality of solder interconnects, wherein the first bridge is configured to provide at least one first electrical path between the first integrated device and the second integrated device, and wherein the first bridge is coupled to a top portion of the first integrated device and a top portion of the second integrated device, through at least the third plurality of solder interconnects; and a second bridge coupled to the first integrated device and the second integrated device through a fourth plurality of solder interconnects.

25 Claims, 16 Drawing Sheets

(51) Int. Cl.
H01L 25/00 (2006.01)
H01L 25/10 (2006.01)

(52) U.S. Cl.
CPC ............ *H01L 25/105* (2013.01); *H01L 25/50* (2013.01); *H01L 2224/16227* (2013.01)

(56) References Cited

U.S. PATENT DOCUMENTS

| | | |
|---|---|---|
| 2019/0109117 A1* | 4/2019 | Fang ........................ H01L 24/96 |
| 2021/0020529 A1 | 1/2021 | McHerron et al. |
| 2021/0225708 A1 | 7/2021 | Lee et al. |
| 2021/0249381 A1 | 8/2021 | Knickerbocker |
| 2021/0398906 A1* | 12/2021 | Qian ................... H01L 23/5385 |
| 2022/0013461 A1 | 1/2022 | Lin et al. |
| 2022/0415808 A1 | 12/2022 | Chava |

* cited by examiner

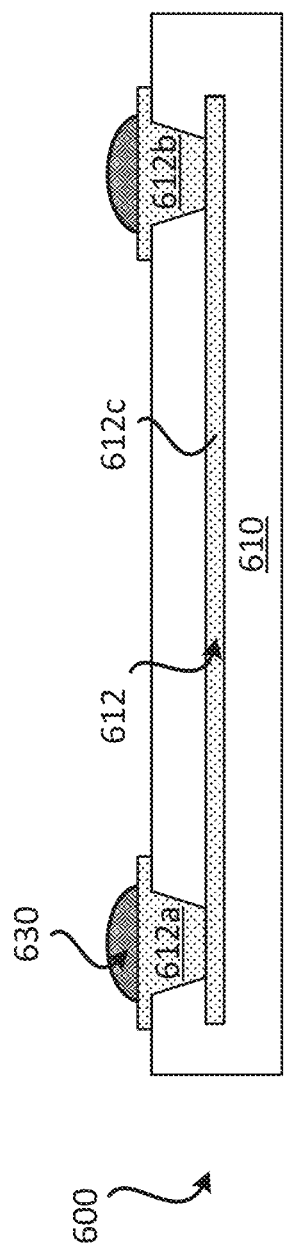

US 12,400,966 B2

PACKAGE COMPRISING INTEGRATED DEVICES AND BRIDGE COUPLING TOP SIDES OF INTEGRATED DEVICES

CROSS-REFERENCE TO RELATED APPLICATION

The present application claims priority to and is a continuation application to U.S. patent application Ser. No. 17/357,811, filed on Jun. 24, 2021 in the U.S. Patent and Trademark Office, the entire content of U.S. patent application Ser. No. 17/357,811 is incorporated herein by reference as if fully set forth below and for all applicable purposes.

FIELD

Various features relate to packages comprising integrated devices

BACKGROUND

A package may include a substrate and several integrated devices. The integrated devices may be in communication with each other through the substrate. That is, electrical input and output signals may travel between integrated devices through the substrate. The performance of the package may be tied to how fast these electrical signals may travel between integrated devices and/or the integrity of the signals between the integrated devices. There is an ongoing need to provide better performing packages.

SUMMARY

Various features relate to packages comprising integrated devices.

One example provides a package comprising a substrate; a first integrated device coupled to the substrate through at least a first plurality of solder interconnects; a second integrated device coupled to the substrate through at least a second plurality of solder interconnects; a first bridge coupled to the first integrated device and the second integrated device through at least a third plurality of solder interconnects, wherein the first bridge is configured to provide at least one first electrical path between the first integrated device and the second integrated device, and wherein the first bridge is coupled to a top portion of the first integrated device and a top portion of the second integrated device, through at least the third plurality of solder interconnects; and a second bridge coupled to the first integrated device and the second integrated device through a fourth plurality of solder interconnects, wherein the second bridge is configured to provide at least one second electrical path between the first integrated device and the second integrated device.

Another example provides a package comprising a substrate; a first stack of dies comprising: a first die; and a second die coupled to the first die through at least a first plurality of solder interconnects, wherein the second die is coupled to the substrate through at least a second plurality of solder interconnects; a second stack of dies comprising: a third die; and a fourth die coupled to the third die through at least a third plurality of solder interconnects, wherein the fourth die is coupled to the substrate through at least a fourth plurality of solder interconnects; a first bridge coupled to the first stack of dies and the second stack of dies through at least a fifth plurality of solder interconnects, wherein the first bridge is configured to provide at least one first electrical path between the first stack of dies and the second stack of dies, and wherein the first bridge is coupled to a top portion of the first stack of dies and a top portion of the second stack of dies, through at least the fifth plurality of solder interconnects; and a second bridge coupled to the first stack of dies and the second stack of dies through a sixth plurality of solder interconnects, wherein the second bridge is configured to provide at least one second electrical path between the first stack of dies and the second stack of dies.

Another example provides a method for fabricating a package. The method provides a substrate. The method couples a first integrated device to the substrate. The method couples a second integrated device to the substrate. The method couples a first bridge to the first integrated device and the second integrated device. The first bridge is configured to provide at least one first electrical path between the first integrated device and the second integrated device. The first bridge is coupled to a top portion of the first integrated device and a top portion of the second integrated device. The method couples a second bridge to the first integrated device and the second integrated device. The second bridge is configured to provide at least one second electrical path between the first integrated device and the second integrated device.

BRIEF DESCRIPTION OF THE DRAWINGS

Various features, nature and advantages may become apparent from the detailed description set forth below when taken in conjunction with the drawings in which like reference characters identify correspondingly throughout.

FIG. 6 illustrates a cross sectional profile view of a bridge structure.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package comprising a substrate, a first integrated device coupled to the substrate, a second integrated device coupled to the substrate, a first bridge and a second bridge. The first bridge is coupled to the first integrated device and the second integrated device. The first bridge is configured to provide at least one first electrical path between the first integrated device and the second integrated device. The first bridge is coupled to a top portion of the first integrated device and a top portion of the second integrated device. The second bridge is coupled to the first integrated device and the second integrated device. The second bridge is configured to provide at least one second electrical path between the first integrated device and the second integrated device. The second bridge may be located at least partially in the substrate. The second bridge may be located above the substrate. The first integrated device may include one or more dies. The second integrated device may include one or more dies. The package may provide better signal integrity for input/output signals between integrated devices, resulting in a better performing package.

Exemplary Packages Comprising a Bridge Coupled to Integrated Devices

Figure 1:
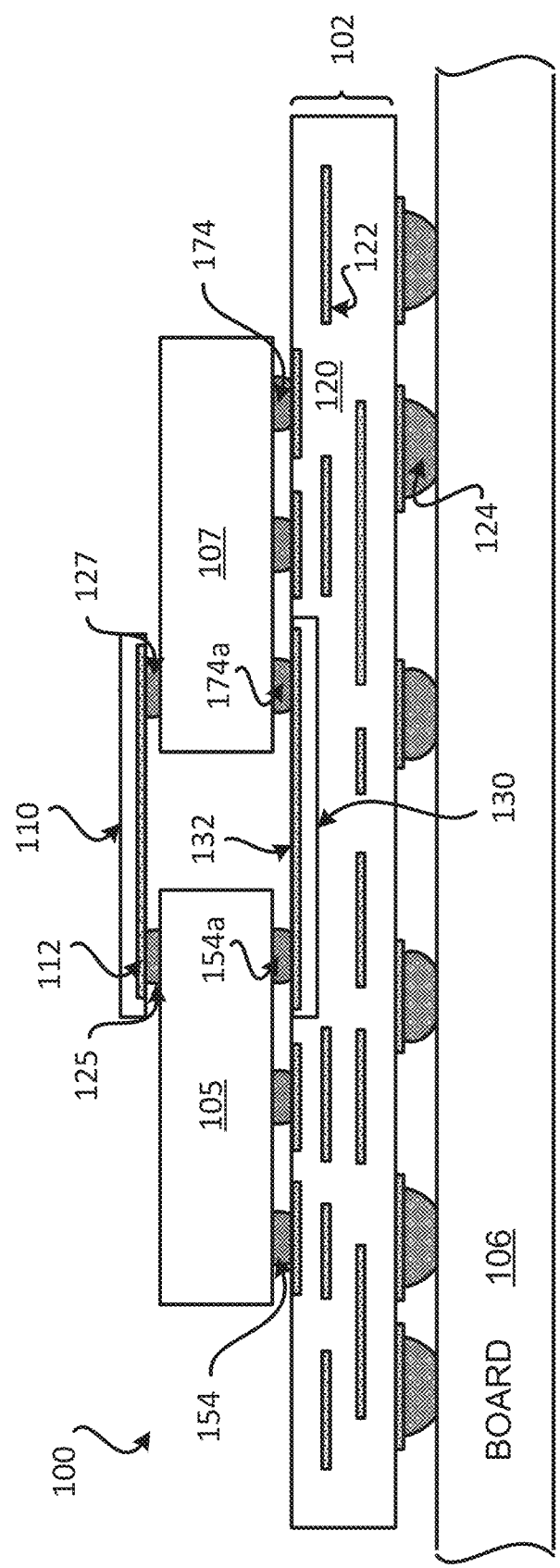
FIG. 1 illustrates a cross sectional profile view of a package that includes a bridge coupled to integrated devices.

FIG. 1 illustrates a cross sectional profile view of a package 100 that includes a substrate 102, an integrated device 105 (e.g., first integrated device), an integrated device 107 (e.g., second integrated device), a bridge 110, and a bridge 130. The package 100 is coupled to a board 106 through a plurality of solder interconnects 124. The board 106 may include a printed circuit board (PCB).

The substrate 102 includes at least one dielectric layer 120 and a plurality of interconnects 122. Different substrates may have different numbers of metal layers. Different implementations may use different substrates for the substrate 102. The substrate 102 may include an embedded trace substrate (ETS), a laminate substrate, a coreless substrate and/or a cored substrate. The substrate 202 may be fabricated using different processes, including an ETS process, a semi-additive process (SAP), and/or a modified semi-additive process (mSAP).

The bridge 130 may be located at least partially in the substrate 102. In some implementations, the bridge 130 may be located in a cavity of the substrate 102. The bridge 130 may be embedded in the substrate 102. The bridge 130 may be a second bridge. The bridge 130 may include at least one bridge interconnect 132. As will be further described below, the bridge 130 may include a bridge die and/or bridge structure. The bridge 130 may be a means for second bridge interconnection. In some implementations, the bridge 130 may be located above the substrate 102. In some implementations, the bridge 130 is not located in the substrate 102.

The integrated device 105 is coupled to the substrate 102 through a plurality of solder interconnects 154. The integrated device 105 is also coupled to the bridge 130 through at least one solder interconnect 154a from the plurality of solder interconnect 154. The integrated device 107 is coupled to the substrate 102 through a plurality of solder interconnects 174. The integrated device 107 is also coupled to the bridge 130 through at least one solder interconnect 174a from the plurality of solder interconnect 174. The bridge 130 may be configured to provide at least one second electrical path between the integrated device 105 and the integrated device 107. For example, the at least one second electrical path between the integrated device 105 and the integrated device 107 may include the at least one solder interconnect 154a, the at least one bridge interconnect 132 and/or the at least one solder interconnect 174a.

The bridge 110 may be coupled to a top portion of the integrated device 105 through at least one solder interconnect 125. The bridge 110 may also be coupled to a top portion of the integrated device 107 through at least one solder interconnect 127. The bridge 110 may be a first bridge. The bridge 110 may include at least one bridge interconnect 112. As will be further described below, the bridge 110 may include a bridge die and/or bridge structure. The bridge 110 may be a means for first bridge interconnection. The bridge 110 may be configured to provide at least one first electrical path between the integrated device 105 and the integrated device 107. For example, the at least one first electrical path between the integrated device 105 and the integrated device 107 may include the at least one solder interconnect 125, the at least one bridge interconnect 112 and/or the at least one solder interconnect 127. In some implementations, one or more input/output (I/O) signals between the integrated device 105 and the integrated device 107 may be configured to travel through the bridge 110 (e.g., configured to travel through the at least one solder interconnect 125, the at least one bridge interconnect 112 and the at least one solder interconnect 127). In some implementations, input/output signals that travel through the bridge 110 may have better signal integrity because the paths are located farther away from interconnects configured as electrical paths for other current (e.g., power). In some implementations, the bridge 110 provides a short electrical path between the integrated device 105 and the integrated device 107, thus providing improved package performance. In some implementations, the bridge 110 frees up solder interconnects to the substrate to be used for power and/or ground, resulting in improved power distribution network (PDN) performance. In some implementations, signals between the integrated device 105 and the integrated device 107 may be configured to travel through a back side of the integrated device 105 and/or the back side of the integrated device 107. In some implementations, the top portion of the integrated device 105 may include the back side of the integrated device 105. In some implementations, the top portion of the integrated device 107 may include the back side of the integrated device 107. The back side of an integrated device may be the side of the integrated device that includes a substrate (e.g., silicon). The front side of an integrated device may be a side opposite to the back side of an integrated device.

Figure 2:
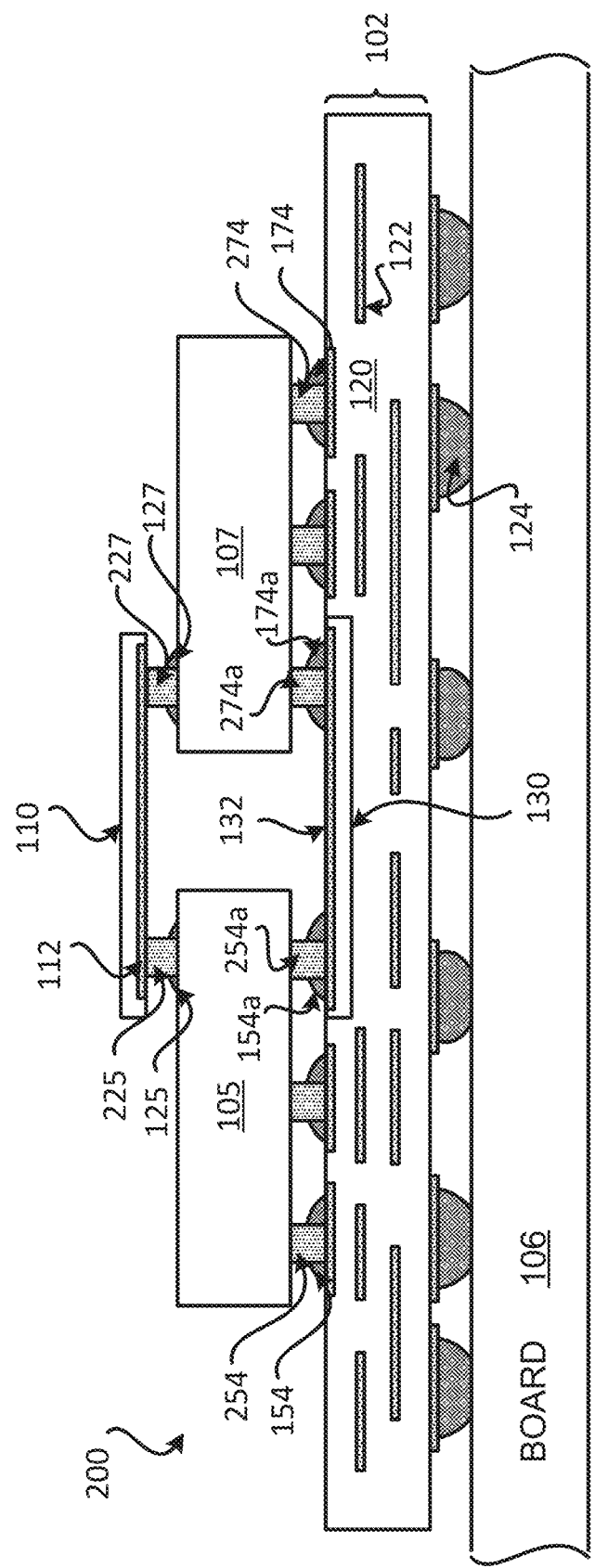
FIG. 2 illustrates a cross sectional profile view of another package that includes a bridge coupled to integrated devices.

FIG. 2 illustrates a cross sectional profile view of a package 200 that includes the substrate 102, the integrated device 105 (e.g., first integrated device), the integrated device 107 (e.g., second integrated device), the bridge 110, and the bridge 130. The package 200 is similar to the package 100. However, the bridge 110 and the bridge 130 may be coupled to the integrated device 105 and the integrated device 107 through a plurality of pillar interconnects.

The integrated device 105 is coupled to the substrate 102 through a plurality of pillar interconnects 254 and the plurality of solder interconnects 154. The integrated device 105 is coupled to the bridge 130 through at least one pillar interconnect 254a and at least one solder interconnect 154a. The integrated device 107 is coupled to the substrate 102 through a plurality of pillar interconnects 274 and the plurality of solder interconnects 174. The integrated device 107 is coupled to the bridge 130 through at least one pillar interconnect 274a and at least one solder interconnect 174a. At least one second electrical path between the integrated device 105 and the integrated device 107 may include the at least one pillar interconnect 254a, the at least one solder interconnect 154a, the at least one bridge interconnect 132 (of the bridge 130), the at least one pillar interconnect 274a, and/or the at least one solder interconnect 174a.

The bridge 110 is coupled to a top portion of the integrated device 105 through at least one pillar interconnect 225 and at least one solder interconnect 125. The bridge 110 is coupled to a top portion of the integrated device 107 through at least one pillar interconnect 227 and at least one solder interconnect 127. At least one first electrical path between the integrated device 105 and the integrated device 107 may include the at least the at least one solder interconnect 125, one pillar interconnect 225, the at least one bridge interconnect 112 (of the bridge 110), the at least one pillar interconnect 227, and/or the at least one solder interconnect 127.

As will be further described below, the integrated device 105 may include one or more integrated devices (e.g., dies). Similarly, the integrated device 107 may include one or more integrated devices (e.g., dies).

Figure 3:
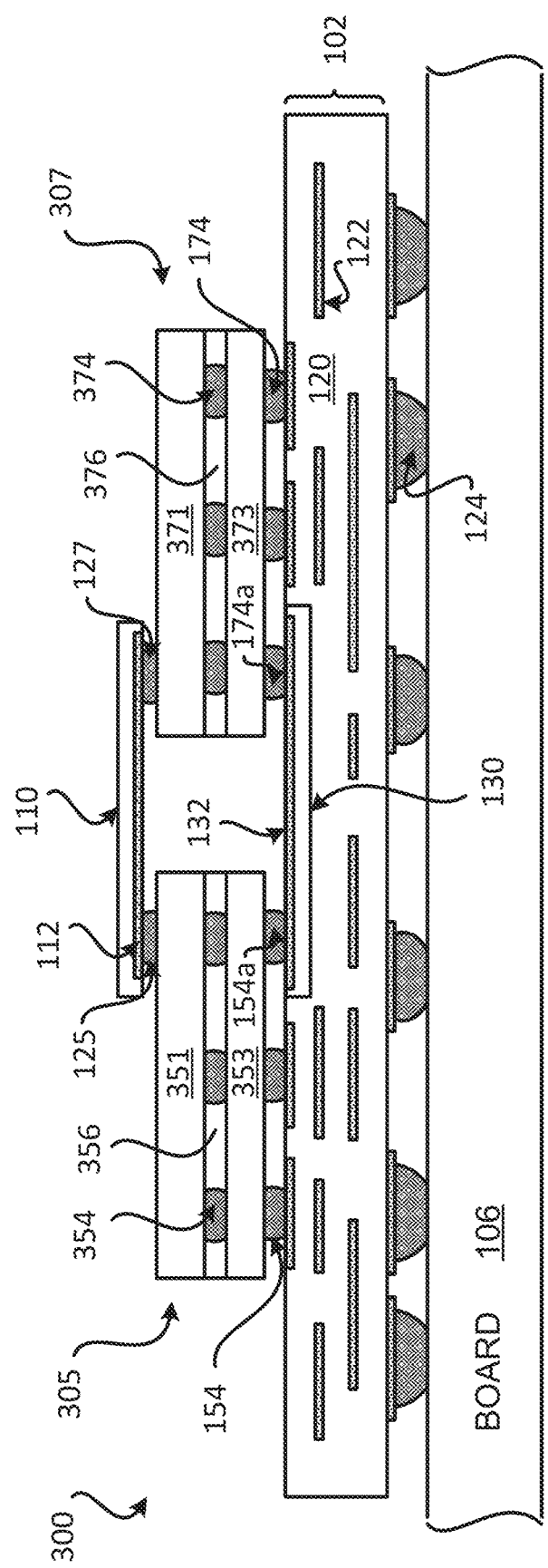
FIG. 3 illustrates a cross sectional profile view of another package that includes a bridge coupled to integrated devices.

FIG. 3 illustrates a cross sectional profile view of a package 300 that includes the substrate 102, an integrated device 305 (e.g., first integrated device), an integrated device 307 (e.g., second integrated device), the bridge 110, and the bridge 130.

The integrated device 305 may be a package that includes a first die 351, a second die 353 and an encapsulation layer 356. The first die 351 and/or the second die 353 may be examples of integrated devices. The second die 353 may be coupled to the first die 351 through a plurality of solder interconnects 354. The first die 351 may be located over (e.g., above) the second die 353. The encapsulation layer 356 may be located between the first die 351 and the second die 353. In some implementations, the encapsulation layer 356 may at least partially encapsulate the first die 351 and/or the second die 353. The integrated device 305 is coupled to the substrate 102 and the bridge 130 through a plurality of solder interconnects 154.

As will be further described below, the first die 351 and the second die 353 may be aligned and positioned in different directions in the integrated device 305. The first die 351 may include a front side and a back side. The second die 353 may also include a front side and a back side. In some implementations, the front side of the first die 351 may face the front side of the second die 353. In some implementations, the front side of the second die 353 may face the back side of the first die 351. In some implementations, the back side of the second die 353 may face the front side of the first die 351. A back side of a die may be a side of the die that includes a die substrate (e.g., silicon). The front side of a die may be a side opposite to the back side of a die.

The integrated device 307 may be a package that includes a third die 371, a fourth die 373 and an encapsulation layer 376. The third die 371 and/or the fourth die 373 may be examples of integrated devices. The fourth die 373 may be coupled to the third die 371 through a plurality of solder interconnects 374. The third die 371 may be located over (e.g., above) the fourth die 373. The encapsulation layer 376 may be located between the third die 371 and the fourth die 373. In some implementations, the encapsulation layer 376 may at least partially encapsulate the third die 371 and/or the fourth die 373. The integrated device 307 is coupled to the substrate 102 and the bridge 130 through a plurality of solder interconnects 174. An encapsulation layer (e.g., 356, 376) may include a mold, a resin and/or an epoxy. An encapsulation layer (e.g., 356, 376) may be a means for encapsulation.

As will be further described below, the third die 371 and the fourth die 373 may be aligned and positioned in different directions in the integrated device 307. The third die 371 may include a front side and a back side. The fourth die 373 may also include a front side and a back side. In some implementations, the front side of the third die 371 may face the front side of the fourth die 373. In some implementations, the front side of the fourth die 373 may face the back side of the third die 371. In some implementations, the back side of the fourth die 373 may face the front side of the third die 371.

Different implementations may position the dies in the package 300 differently. In some implementations, the back side of the first die 351 and/or the back side of the third die 371 may face the bridge 110. In some implementations, the front side of the first die 351 and/or the front side of the third die 371 may face the bridge 110. In some implementations, the back side of the second die 353 and/or the back side of the fourth die 373 may face the bridge 130 and/or the substrate 102. In some implementations, the front side of the second die 353 and/or the front side of the fourth die 373 may face the bridge 130 and/or the substrate 102.

The bridge 110 is coupled to the first die 351 through the at least one solder interconnect 125. The bridge 110 is coupled to the third die 371 through the at least one solder interconnect 127. The first die 351 may be configured to be electrically coupled to the third die 371 through the bridge 110. At least one first electrical path (e.g., for input/output signals) between the first die 351 and the third die 371 may include the at least one solder interconnect 125, the at least one bridge interconnect 112, and/or the at least one solder interconnect 127. The bridge 110 provide a shorter electrical path between the first die 351 and the third die 371, by not having to travel through the second die 353, the substrate 102, the bridge 130 and/or the fourth die 373.

The bridge 130 is coupled to the second die 353 through the at least one solder interconnect 154a. The bridge 130 is coupled to the fourth die 373 through the at least one solder interconnect 174a. The second die 353 may be configured to be electrically coupled to the fourth die 373 through the bridge 130. At least one second electrical path (e.g., for input/output signals) between the second die 353 and the fourth die 373 may include the at least one solder interconnect 154a, the at least one bridge interconnect 132, and/or the at least one solder interconnect 174a.

In some implementations, power to the integrated device 305, including power to the first die 351 and/or the second die 353 may be provided through the substrate 102 (e.g., plurality of interconnects 122) and at least one solder interconnect 154. In some implementations, power to the first die 351 may be provided through the substrate 102 (e.g., plurality of interconnects 122), at least one solder interconnect 154, the second die 353 and at least one solder interconnect 354. In some implementations, power to the integrated device 307, including power to the third die 371 and/or the fourth die 373 may be provided through the substrate 102 (e.g., plurality of interconnects 122) and at least one solder interconnect 174. In some implementations, power to the third die 371 may be provided through the substrate 102 (e.g., plurality of interconnects 122), at least one solder interconnect 174, the fourth die 373 and at least one solder interconnect 374. It is noted that the integrated device 305 may include more than two stacked dies. Similarly, the integrated device 307 may include more than two stacked dies.

Figure 4:
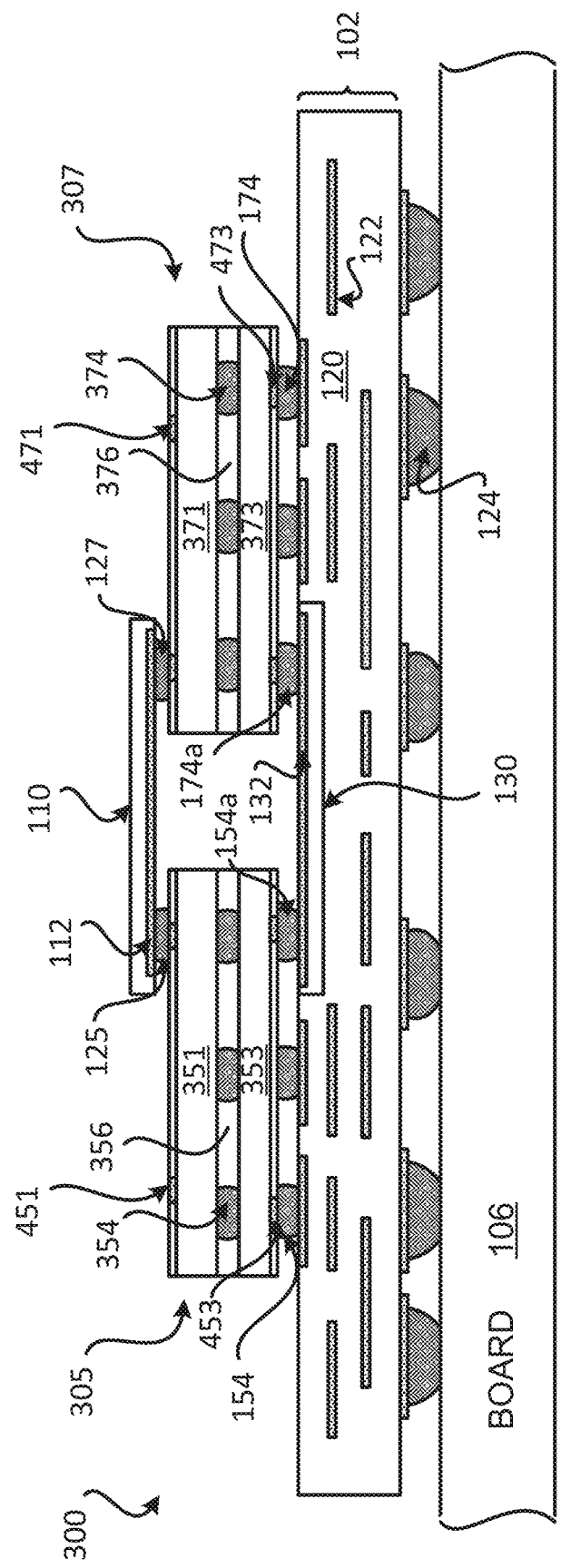
FIG. 4 illustrates a cross sectional profile view of another package that includes a bridge coupled to stacked dies.

FIG. 4 illustrates a cross sectional profile view of an implementation of the package 300. As shown in FIG. 4, the first die 351 is coupled to the second die 353 such that the front side of the first die 351 faces the front side of the second die 353. The back side of a die may be a side that includes a die substrate (e.g., silicon). The front side of a die may be a side that is opposite to the back side of a die. The first die 351 includes a plurality of through substrate vias (TSVs) 451. The plurality of TSVs 451 may be located in the back side of the first die 351. The second die 353 includes a plurality of through substrate vias (TSVs) 453. The plurality of TSVs 453 may be located in the back side of the second die 353.

Similarly, the third die 371 is coupled to the fourth die 373 such that the front side of the third die 371 faces the front side of the fourth die 373. The third die 371 includes a plurality of through substrate vias (TSVs) 471. The plurality of TSVs 471 may be located in the back side of the third die 371. The fourth die 373 includes a plurality of through substrate vias (TSVs) 473. The plurality of TSVs 473 may be located in the back side of the fourth die 373.

In some implementations, the back side of the first die 351 and the back side of the third die 371 may face the bridge 110. In some implementations, the front side of the first die 351 and the front side of the third die 371 may face the substrate 102 and/or the bridge 130. In some implementations, at least one electrical current (e.g., input/output signal) may travel between the first die 351 and the third die 371 through the plurality of TSVs 451, the at least one solder interconnect 125, the at least one bridge interconnect 112, the at least one solder interconnect 127, and the plurality of TSVs 471.

In some implementations, at least one electrical current (e.g., input/output signal) may travel between the second die 353 and the fourth die 373 through the plurality of TSVs 453, the at least one solder interconnect 154*a*, the at least one bridge interconnect 132, the at least one solder interconnect 174*a*, and the plurality of TSVs 473.

In some implementations, the first die 351 and the second die 353 may each be configured to be electrically coupled to the substrate 102. In some implementations, at least one electrical current (e.g., power) between the first die 351 and the substrate 102 may travel through the plurality of solder interconnect 154, the plurality of TSVs 453, the second die 353 and the plurality of solder interconnects 354. In some implementations, at least one electrical current (e.g., power) between the second die 353 and the substrate 102 may travel through the plurality of solder interconnect 154 and the plurality of TSVs 453.

In some implementations, the third die 371 and the fourth die 373 may each be configured to be electrically coupled to the substrate 102. In some implementations, at least one electrical current (e.g., power) between the third die 371 and the substrate 102 may travel through the plurality of solder interconnect 174, the plurality of TSVs 473, the fourth die 373 and the plurality of solder interconnects 354. In some implementations, at least one electrical current (e.g., power) between the fourth die 373 and the substrate 102 may travel through the plurality of solder interconnect 174 and the plurality of TSVs 473.

FIG. 4 illustrates one example of how stacked dies may be implemented. However, as mentioned above, the dies may be arranged in different directions and may include different numbers of dies. The disclosure illustrates and describes the bridge 130 as being located at least partially (e.g., embedded) in the substrate 102. However, in some implementations, the bridge 130 may be located over the substrate 102. For example, the bridge 130 may be located between integrated devices and the substrate 102. Thus, in some implementations, the bridge 130 is not located in the substrate 102.

FIGS. 3 and 4 illustrate examples of packages where the first integrated device (e.g., 305) includes two dies and the second integrated device (307) includes two dies. However, a package may include other configurations and combinations of integrated devices. For example, a first integrated device may include one die and a second integrated device may include two dies. In another example, a first integrated device may include two dies and a second integrated device may include three or more dies. In some implementations, a package may include a first integrated device, a second integrated device, a third integrated device and a fourth integrated device, that are all coupled to a substrate. A bridge may be coupled to the top portions of the first integrated device and the second integrated device. Another bridge may be coupled to the top portions of the third integrated device and the fourth integrated device. A top portion of an integrated device may include a side of the integrated device that faces away from a substrate.

An integrated device (e.g., 105, 107, 305, 307) may include a die (e.g., semiconductor bare die). The integrated device may include a chip, a chiplet, a radio frequency (RF) device, a passive device, a filter, a capacitor, an inductor, an antenna, a transmitter, a receiver, a GaAs based integrated device, a surface acoustic wave (SAW) filters, a bulk acoustic wave (BAW) filter, a light emitting diode (LED) integrated device, a silicon (Si) based integrated device, a silicon carbide (SiC) based integrated device, a processor, a memory, a power management integrated device and/or combinations thereof. An integrated device (e.g., 105, 107, 305, 307) may include at least one electronic circuit (e.g., first electronic circuit, second electronic circuit, etc. . . . ).

Figure 5:
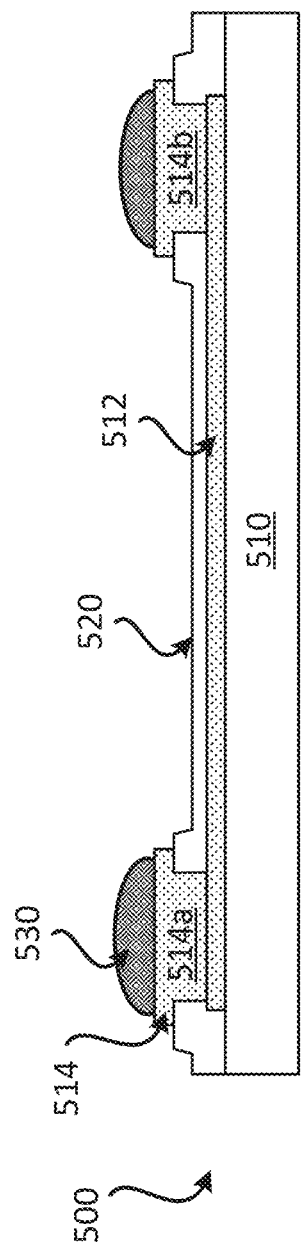
FIG. 5 illustrates a cross sectional profile view of a bridge die.

FIG. 5 illustrates a view of a bridge 500. The bridge 500 may be a bridge die. The bridge 500 may be a passive bridge die. The bridge 500 may represent the bridge 110 and/or the bridge 130 in the disclosure. The bridge 500 may be a means for bridge interconnection. The bridge 500 includes a die substrate 510 (e.g., bridge die substrate), at least one bridge interconnect 512, a passivation layer 520, a plurality of under bump interconnects 514 and a plurality of solder interconnect 530. The die substrate 510 may include silicon (Si). The at least one bridge interconnect 512 may be coupled to the plurality of under bump interconnects 514. In some implementations, the at least one bridge interconnect 512 may include rows of bridge interconnects. The plurality of solder interconnects 530 may be coupled to the plurality of under bump interconnects 514. It is noted that plurality of under bump interconnects 514 may considered part of the bridge interconnect for the bridge 500. Thus, a bridge interconnect may also refer to at least one under bump interconnect of a bridge. The bridge 500 is configured to allow one or more electrical currents (e.g., input/output signals) to travel through the under bump interconnect 514*a*, the at least one bridge interconnect 512 and the under bump interconnect 514*b*.

FIG. 6 illustrates a view of a bridge 600. The bridge 600 may be a bridge structure and/or a bridge substrate. The bridge 600 may represent the bridge 110 and/or the bridge 130 in the disclosure. The bridge 600 may be a means for bridge interconnection. The bridge 600 includes at least one dielectric layer 610, at least one bridge interconnect 612 and a plurality of solder interconnect 530. The at least one bridge interconnect 612 includes a bridge interconnect 612a (e.g., bridge via, bridge pad), a bridge interconnect 612c (e.g., bridge trace) and a bridge interconnect 612b (e.g., bridge via, bridge pad). The bridge 600 is configured to allow one or more electrical currents (e.g., input/output signals) to travel through the bridge interconnect 612a, the bridge interconnect 612c and the bridge interconnect 612b. In some implementations, there be several rows of the bridge interconnect 612a, the bridge interconnect 612c and the bridge interconnect 612b.

Figure 8:
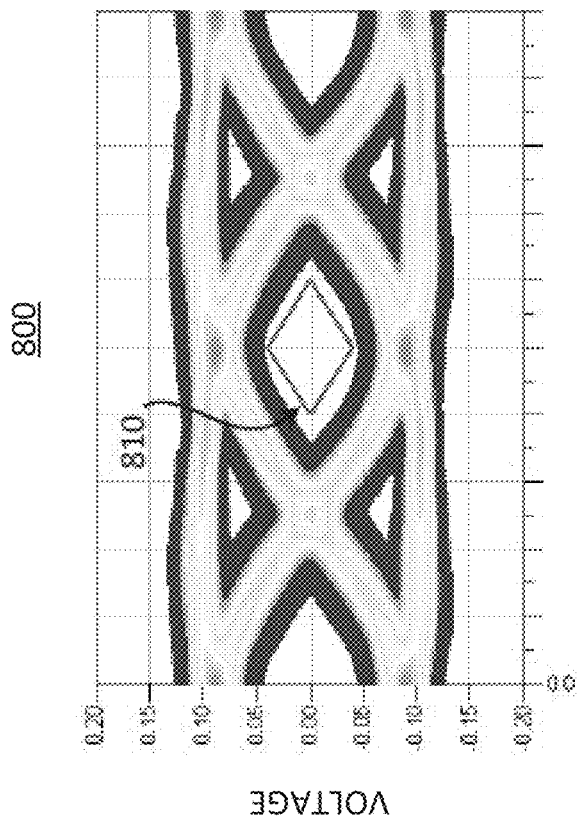
FIG. 8 illustrates an exemplary graph of signal integrity for signals between integrated devices using a bridge connection.
Figure 7:
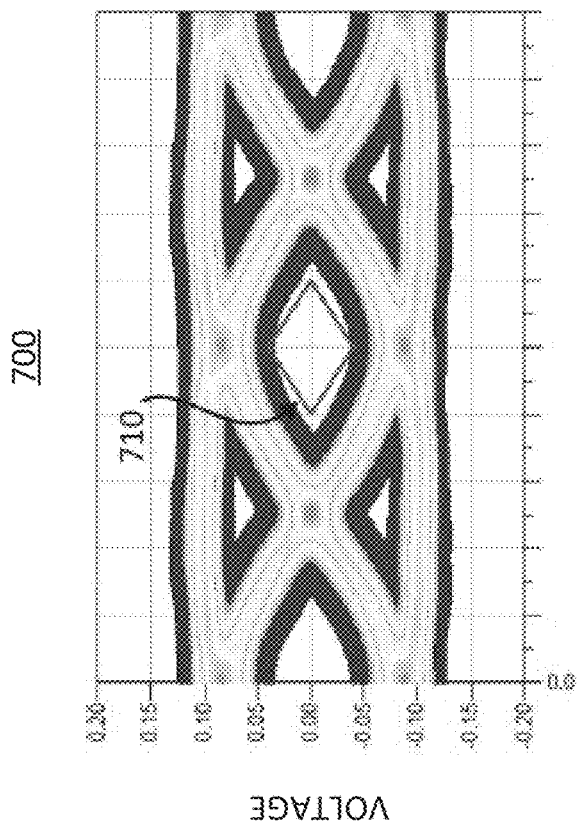
FIG. 7 illustrates an exemplary graph of signal integrity for signals between integrated devices using a non-bridge connection.

FIGS. 7 and 8 illustrate graphs of exemplary signal integrity between two integrated devices. FIG. 7 illustrates an exemplary graph 700 of signal integrity between two integrated devices, where the signals travel through a non-bridge connection. FIG. 8 illustrates an exemplary graph 800 of signal integrity between two integrated devices, where the signals travel through a bridge coupled to top portions of integrated devices. The graph 700 illustrates an eye opening 710. The graph 800 illustrates an eye opening 810. The eye opening 810 is greater than the eye opening 710, which may indicate that signals traveling through the bridge may have better signal integrity, including signals with less cross talk, improved differential insertion loss, improved intra-pair skew and/or improved mode conversion, relative to signals that may not be traveling through a bridge. These improvements in signal integrity may be because of shorter routing distances between integrated devices, and/or more availability of power and ground bumps for the integrated devices. That is, bumps and/or solder interconnects between the integrated devices and a substrate that would normally be used for signals routing may be used instead for power and ground, which may ultimately help improve the power distribution network (PDN) performance of the integrated devices and the package.

Having described various packages, a sequence for fabricating a package will now be described below.

Figure 9A:
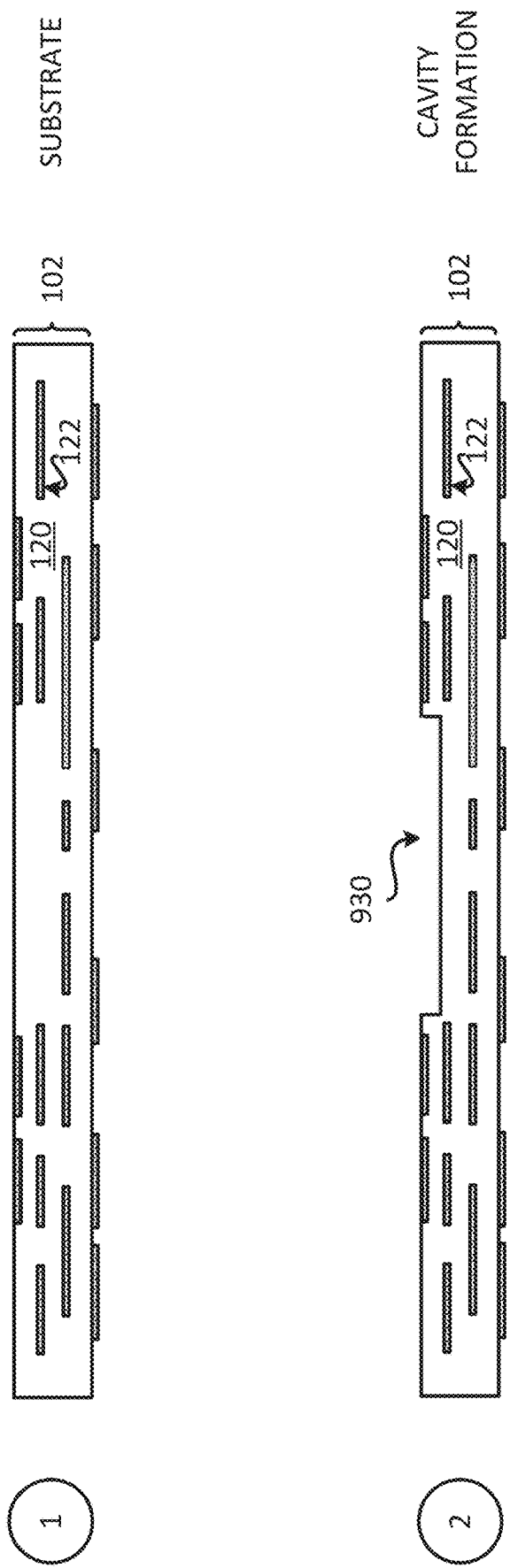
FIGS. 9A-9C illustrate an exemplary sequence for fabricating a package that includes a bridge coupled to integrated devices.
Figure 9B:
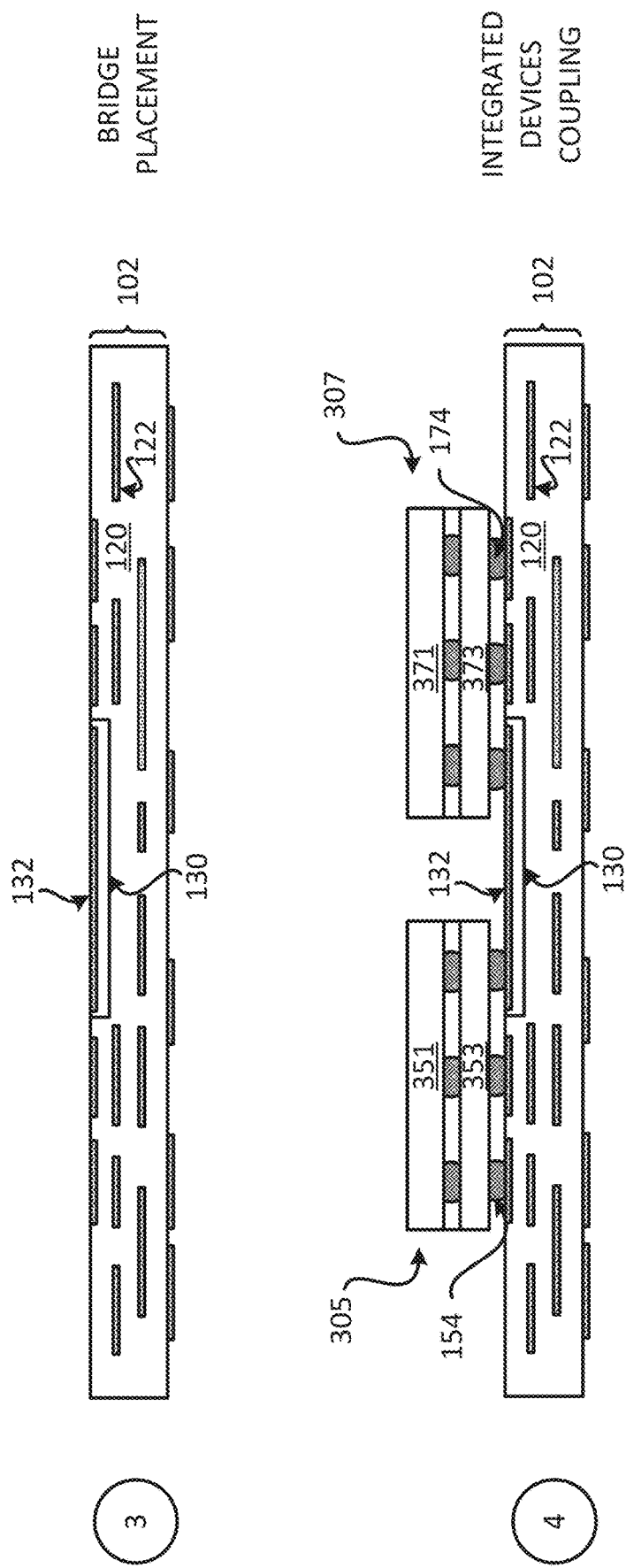
Figure 9C:
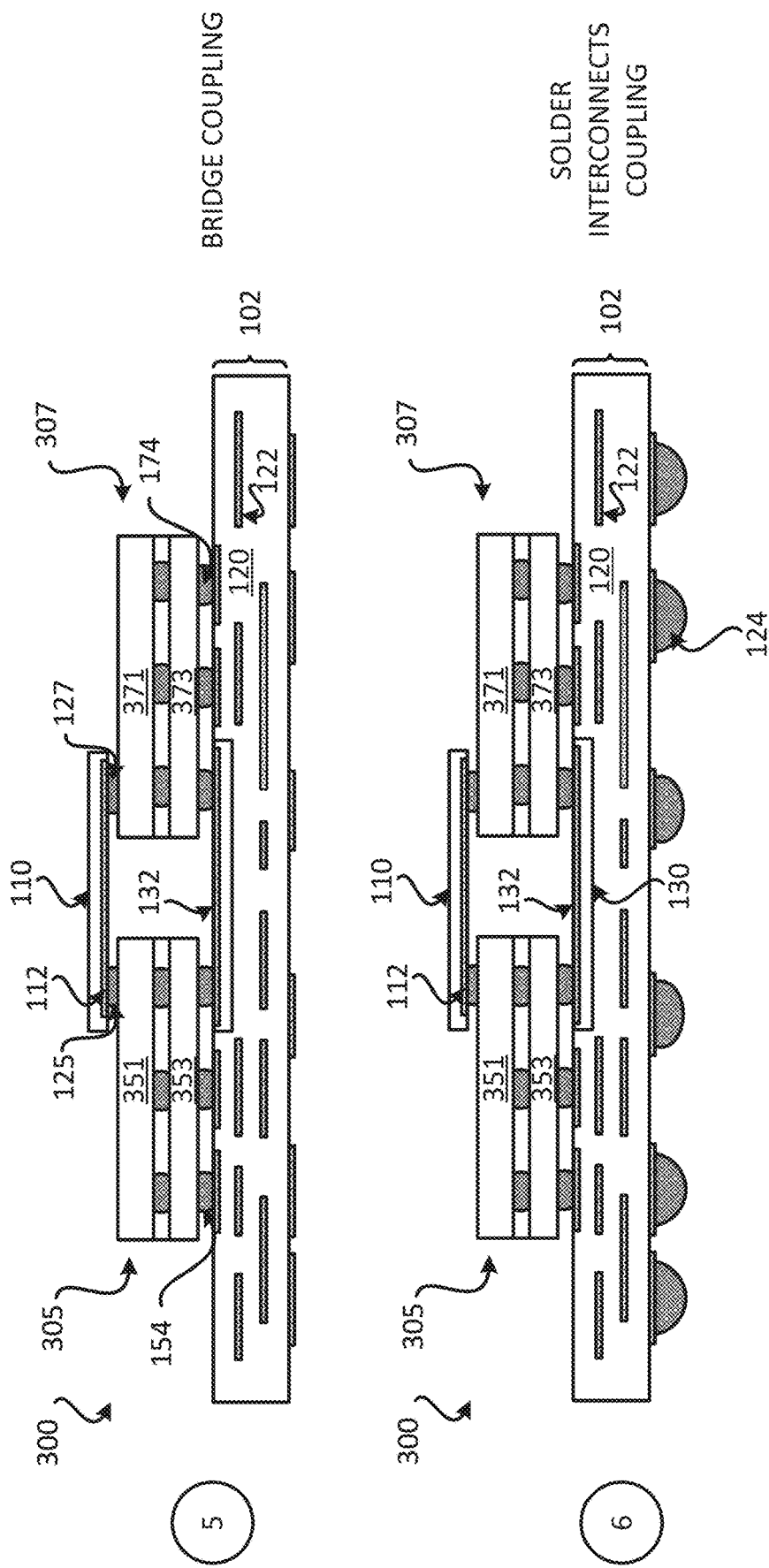

Exemplary Sequence for Fabricating a Packages Comprising a Bridge Coupled to Integrated Devices FIGS. 9A-9C illustrate an exemplary sequence for providing or fabricating a package that includes a bridge coupled to integrated devices. In some implementations, the sequence of FIGS. 9A-9C may be used to provide or fabricate the package 300 of FIG. 3, or any of the packages described in the disclosure.

It should be noted that the sequence of FIGS. 9A-9C may combine one or more stages in order to simplify and/or clarify the sequence for providing or fabricating a package. In some implementations, the order of the processes may be changed or modified. In some implementations, one or more of processes may be replaced or substituted without departing from the spirit of the disclosure. Different implementations may fabricate a package differently.

Stage 1, as shown in FIG. 9A, illustrates a state after a substrate 102 is provided. The substrate 102 may be fabricated or provided by a supplier. The substrate 102 includes at least one dielectric layer 120 and a plurality of interconnects 122. The substrate 102 may include different numbers of metal layers. The substrate 102 may include a laminated substrate, a cored substrate and/or a coreless substrate (e.g., ETS). An example of fabricating a substrate is further described below in at least FIGS. 11A-11C.

Stage 2 illustrates a state after a cavity 930 is formed in the substrate 102. Different implementations may form the cavity 930 differently. In some implementations, a laser process (e.g., laser ablation) may be used to form the cavity 930. Different implementations may have a cavity with different sizes, shapes and depths. It is noted that the cavity 930 may already be formed in the substrate 102 when the substrate 102 is provided at Stage 1 of FIG. 9A.

Stage 3, as shown in FIG. 9B, illustrates a state after the bridge 130 is placed at least partially in the cavity 930 of the substrate 102. In some implementations, an adhesive (which is not shown) may be used to place and couple the bridge 130 to the substrate 102. The bridge 130 includes at least one bridge interconnect 132. The bridge 130 may include the bridge 500 or the bridge 600. It is noted that bridge 130 may be provided during a different stage of the process. For example, the bridge 130 may be coupled to the integrated devices before the bridge 130 is coupled to the substrate 102. In some implementations, the bridge 130 may be coupled to integrated devices after the integrated devices have been coupled to the substrate 102.

Stage 4 illustrates a state a state after the integrated device 305 and the integrated device 307 are coupled to the substrate 102. The integrated device 305 is coupled to the substrate 102 through the plurality of solder interconnect 154. The integrated device 305 is also coupled to the bridge 130 through the plurality of solder interconnects 154. The integrated device 307 is coupled to the substrate 102 through the plurality of solder interconnect 174. The integrated device 307 is also coupled to the bridge 130 through the plurality of solder interconnects 174. As shown in Stage 4, the integrated device 305 includes a first die 351 and a second die 353. Similarly, the integrated device 307 includes a third die 371 and a fourth die 373. A solder reflow process may be used to couple the integrated device 305 and the integrated device 307 to the substrate 102 and the bridge 130. It is noted that in some implementations, a plurality of pillar interconnects (as described in FIG. 2) may be used to couple the integrated device 305 and the integrated device 307 to the substrate 102 and the bridge 130. Thus, in some implementations, coupling the integrated device 305 and the integrated device 307 to the substrate 102 may also include coupling the integrated device 305 and the integrated device 307 to the bridge 130. However, in some implementations, the integrated device 305 and the integrated device 307 may be coupled to the bridge 130 during a different sequence. For example, the bridge 130 may be coupled to the integrated device 305 and the integrated device 307, and then the coupled integrated device 305, the integrated device 307, the bridge 130 may be coupled to the substrate 102. In another example, the bridge 130 may be coupled to the integrated device 305 and the integrated device 307, after the integrated device 305 and the integrated device 307 have been coupled to the substrate 102. For example, there may be a cavity in the substrate 102 that extends through the substrate 102. The integrated device 305 and the integrated device 307 may be coupled to the substrate 102, and the bridge 130 may be coupled to the integrated device 305 and the integrated device 307 through the cavity that extends through the substrate 102.

Stage 5, as shown in FIG. 9C, illustrates a state after the bridge 110 is coupled to a top portion of the integrated device 305 and a top portion of the integrated device 307. The bridge 110 may be coupled to the integrated device 305 through the at least one solder interconnect 125. The bridge 110 may be coupled to the integrated device 307 through the at least one solder interconnect 127. A solder reflow process may be used to couple the bridge 110 to the integrated device 305 and the integrated device 307. It is noted that in some implementations, a plurality of pillar interconnects (as described in FIG. 2) may be used to couple the bridge 110 to the integrated device 305 and the integrated device 307.

Stage 6 illustrates a state the plurality of solder interconnects 124 is coupled to a bottom surface of the substrate 102. A solder reflow process may be used to couple the plurality of solder interconnects 124 to the substrate 102. The plurality of solder interconnects 124 may be coupled to pad interconnects from the plurality of interconnects 122. Stage 6 may illustrate the package 300.

Figure 10:
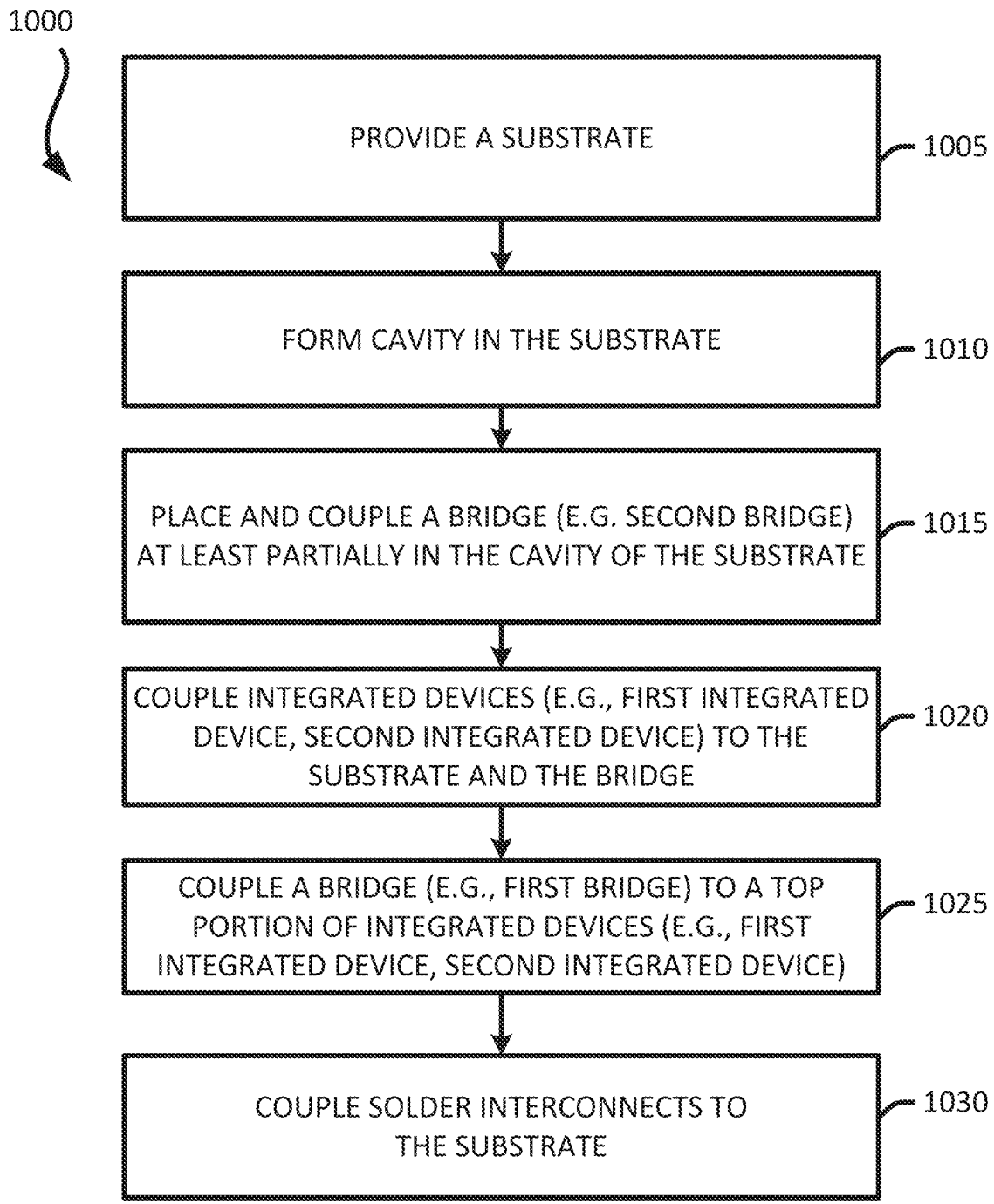
FIG. 10 illustrates an exemplary flow diagram of a method for fabricating a package that includes a bridge coupled to integrated devices.

Exemplary Flow Diagram of a Method for Fabricating a Packages Comprising a Bridge Coupled to Integrated Devices In some implementations, fabricating a package includes several processes. FIG. 10 illustrates an exemplary flow diagram of a method 1000 for providing or fabricating a package that includes a bridge coupled to integrated devices. In some implementations, the method 1000 of FIG. 10 may be used to provide or fabricate the package 300 of FIG. 3. However, the method 1000 of FIG. 10 may be used fabricate any package in the disclosure.

It should be noted that the method of FIG. 10 may combine one or more processes in order to simplify and/or clarify the method for providing or fabricating a package. In some implementations, the order of the processes may be changed or modified.

The method provides (at 1005) a substrate (e.g., 102). The substrate 102 may include at least one dielectric layer 120 and a plurality of interconnects 122. The substrate 102 may include different numbers of metal layers. The substrate 102 may include a laminated substrate, a cored substrate and/or a coreless substrate (e.g., ETS). The substrate may be provided by a supplier or fabricated. An example of fabricating a substrate is further described below in at least FIGS. 11A-11C. Stage 1 of FIG. 9A illustrates and describes an example of providing a substrate.

The method forms (at 1010) a cavity (e.g., 930) in the substrate (e.g., 102). Different implementations may form the cavity 930 differently. In some implementations, a laser process (e.g., laser ablation) may be used to form the cavity 930. Different implementations may have a cavity with different sizes, shapes and depths. In some implementations, the cavity 930 may extend entirely through the substrate 102. It is noted that the cavity 930 may already be formed in the substrate 102 when the substrate 102 is provided (at 1005). Stage 2 of FIG. 9A illustrates and describes an example of a cavity formed in a substrate.

The method places and couples (at 1015) a bridge (e.g., 130) in the cavity 930 of the substrate 102. The bridge 130 may be placed at least partially in the cavity 930. In some implementations, an adhesive (which is not shown) may be used to place and couple the bridge 130 to in the cavity 930 of the substrate 102. The bridge 130 includes at least one bridge interconnect 132. The bridge 130 may include the bridge 500 or the bridge 600. It is noted that the bridge 130 may be coupled to the substrate 102 differently. In some implementations, the bridge 130 may be coupled to integrated devices before being coupled to the substrate 102 or before being positioned over the substrate 102. Stage 3 of FIG. 9B illustrates and describes an example of a bridge that is placed at least partially in a cavity of a substrate.

The method couples (at 1020) a plurality of integrated devices (e.g., 105, 107, 305, 307) to the substrate 102 and the bridge 130. The plurality of integrated devices may be coupled to the substrate 102 and the bridge 130 through a plurality of solder interconnect (e.g., 154, 174) and/or a plurality of pillar interconnects (e.g., 254, 274). A solder reflow process may be used to couple the integrated devices (e.g., 105, 107, 305, 307) to the substrate 102 and the bridge 130. In some implementations, the bridge 130 may be coupled to the integrated devices before the integrated devices are coupled to the substrate 102. It is noted that in some implementations, a plurality of pillar interconnects (as described in FIG. 2) may be used to couple the integrated devices to the substrate 102 and the bridge 130. Stage 4 of FIG. 9B illustrates and describes an example of coupling integrated devices to a substrate and a bridge.

The method couples (at 1025) a bridge (e.g., 110) to top portions of a plurality of integrated devices. For example, the bridge 110 may be coupled to a top portion of the integrated device 305 and a top portion of the integrated device 307. The bridge 110 may be coupled to the integrated device 305 through the at least one solder interconnect 125. The bridge 110 may be coupled to the integrated device 307 through the at least one solder interconnect 127. A solder reflow process may be used to couple the bridge 110 to the integrated device 305 and the integrated device 307. It is noted that in some implementations, a plurality of pillar interconnects (as described in FIG. 2) may be used to couple the bridge 110 to the integrated device 305 and the integrated device 307. Stage 5 of FIG. 9C illustrates and describes an example of coupling a bridge to integrated devices.

The method couples (at 1030) a plurality of solder interconnects (e.g., 124) a bottom surface of the substrate (e.g., 102). A solder reflow process may be used to couple the plurality of solder interconnects 124 to the substrate 102. The plurality of solder interconnects 124 may be coupled to pad interconnects from the plurality of interconnects 122 of the substrate 102. Stage 6 of FIG. 9C illustrates and describes an example of solder interconnects coupled to substrate.

Exemplary Sequence for Fabricating a Substrate

Figure 11A:
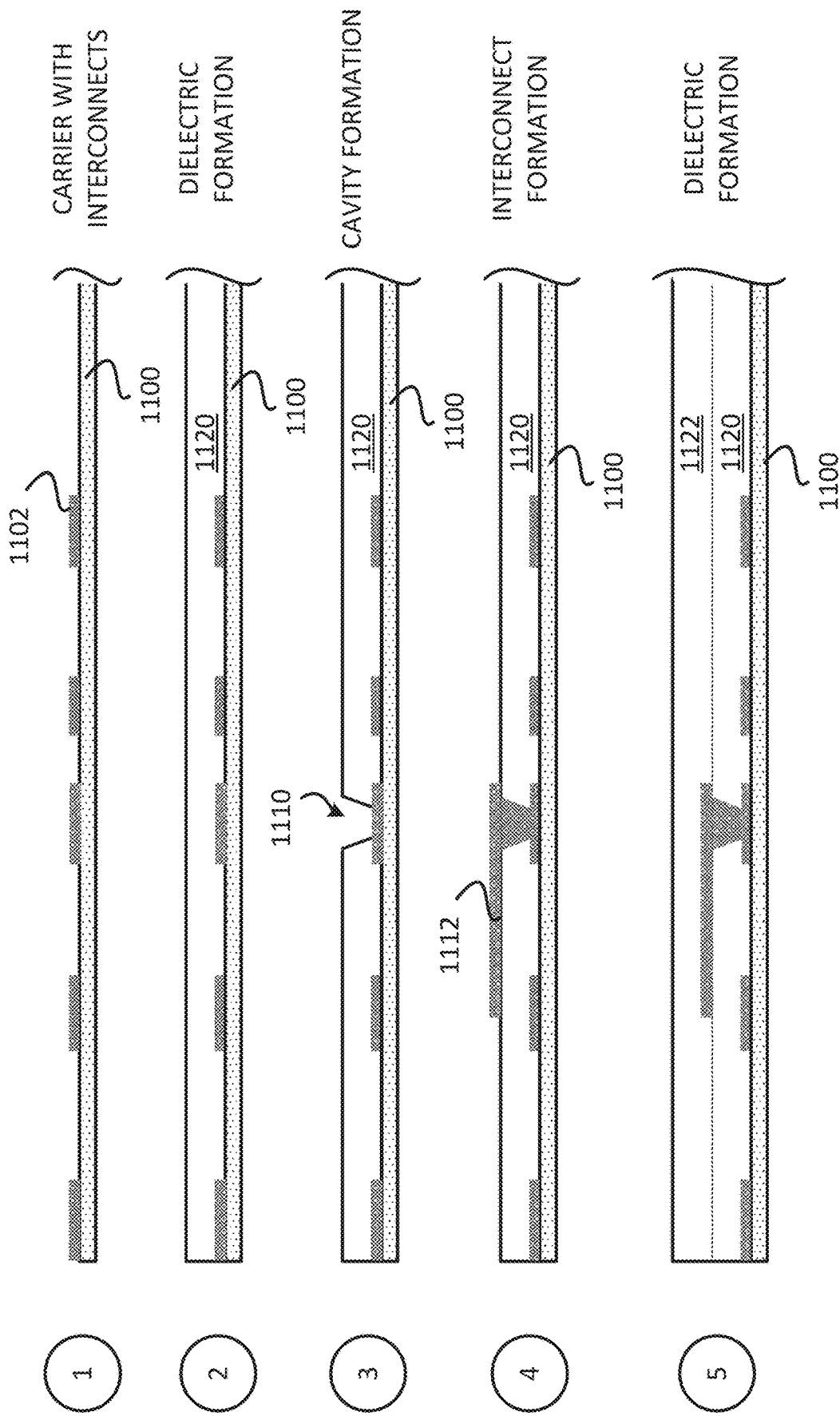
FIGS. 11A-11C illustrate an exemplary sequence for fabricating a substrate.
Figure 11B:
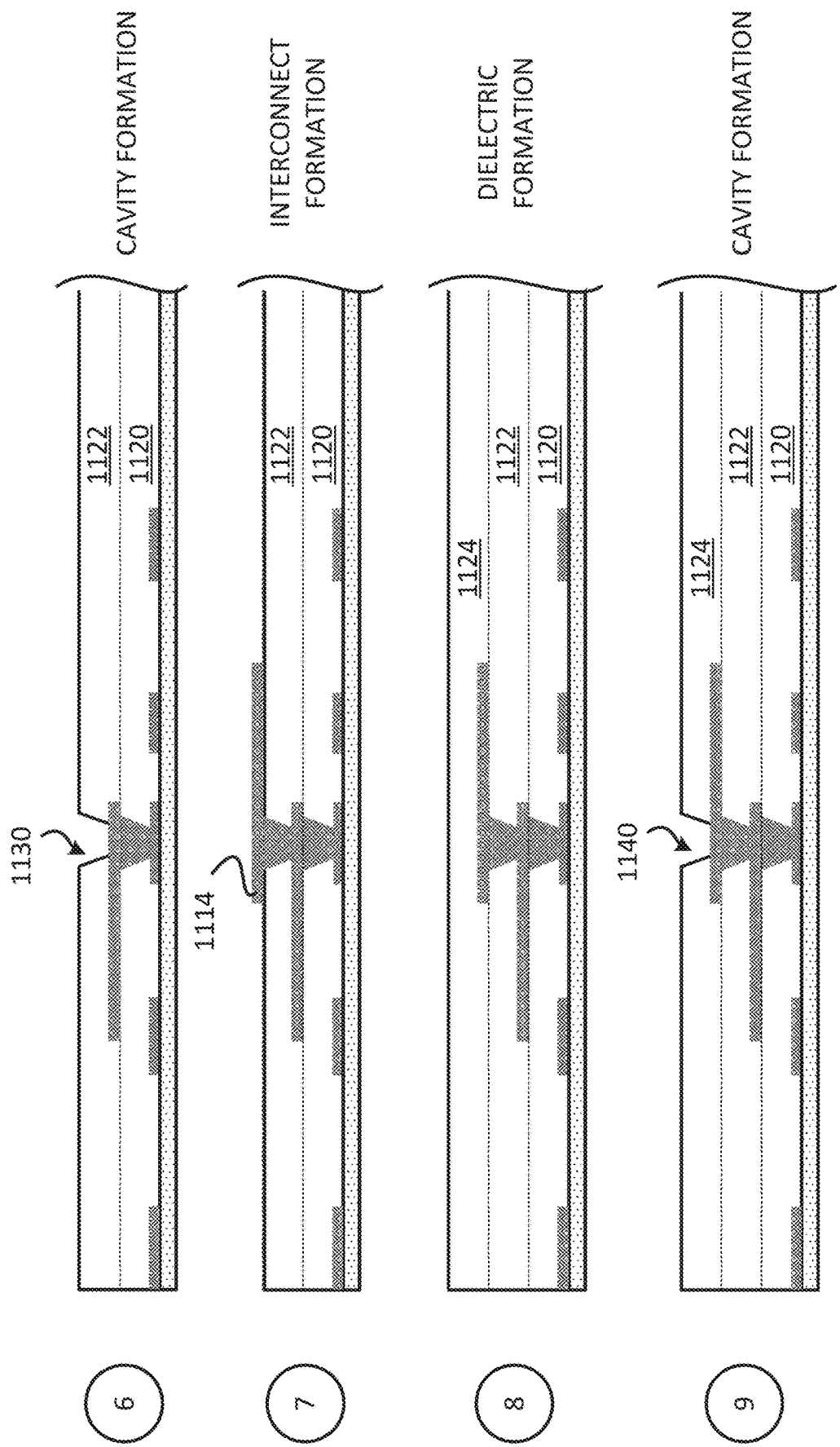
Figure 11C:
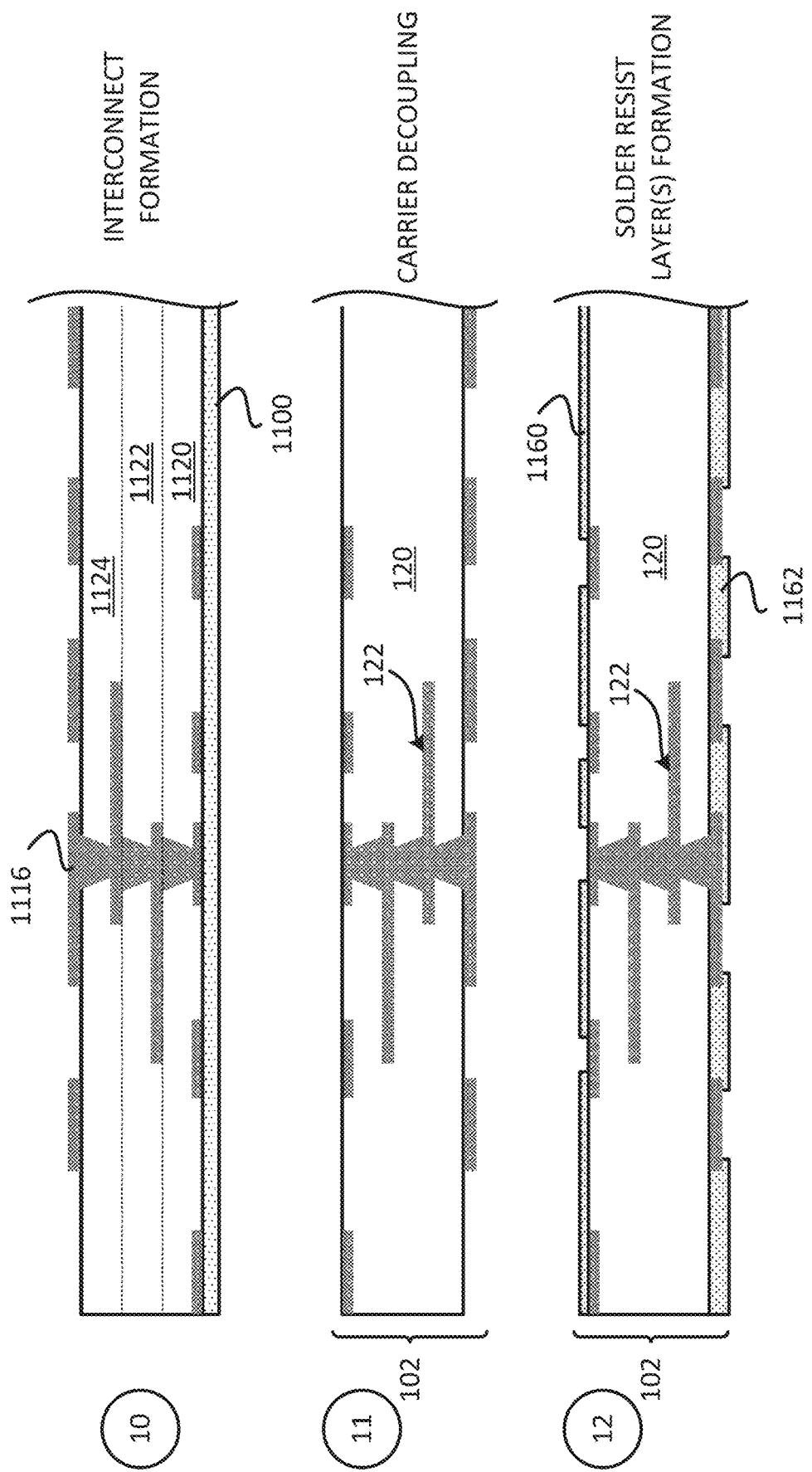

In some implementations, fabricating a substrate includes several processes. FIGS. 11A-11C illustrate an exemplary sequence for providing or fabricating a substrate. In some implementations, the sequence of FIGS. 11A-11C may be used to provide or fabricate the substrate 202 and/or the substrate 204 of FIG. 2. However, the process of FIGS. 11A-11C may be used to fabricate any of the substrates described in the disclosure. In some implementations, at least some aspects of the process of FIGS. 11A-11C may be used to fabricate the bridge 600.

It should be noted that the sequence of FIGS. 11A-11C may combine one or more stages in order to simplify and/or clarify the sequence for providing or fabricating a substrate. In some implementations, the order of the processes may be changed or modified. In some implementations, one or more of processes may be replaced or substituted without departing from the scope of the disclosure.

Stage 1, as shown in FIG. 11A, illustrates a state after a carrier 1100 is provided and a metal layer is formed over the carrier 1100. The metal layer may be patterned to form interconnects 1102. A plating process and etching process may be used to form the metal layer and interconnects. In some implementations, the carrier 1100 may be provided with a metal layer that is patterned to form the interconnects 1102.

Stage 2 illustrates a state after a dielectric layer 1120 is formed over the carrier 1100 and the interconnects 1102. A deposition and/or lamination process may be used to form the dielectric layer 1120. The dielectric layer 1120 may include polyimide. However, different implementations may use different materials for the dielectric layer.

Stage 3 illustrates a state after a plurality of cavities 1110 is formed in the dielectric layer 1120. The plurality of cavities 1110 may be formed using an etching process (e.g., photo etching process) or laser process.

Stage 4 illustrates a state after interconnects 1112 are formed in and over the dielectric layer 1120, including in and over the plurality of cavities 1110. For example, a via, pad and/or traces may be formed. A plating process may be used to form the interconnects.

Stage 5 illustrates a state after another dielectric layer 1122 is formed over the dielectric layer 1120. A deposition and/or lamination process may be used to form the dielectric layer 1122. The dielectric layer 1122 may be the same material as the dielectric layer 1120. However, different implementations may use different materials for the dielectric layer.

Stage 6, as shown in FIG. 11B, illustrates a state after a plurality of cavities 1130 is formed in the dielectric layer 1122. An etching process or laser process may be used to form the cavities 1130.

Stage 7 illustrates a state after interconnects 1114 are formed in and over the dielectric layer 1122, including in and over the plurality of cavities 1130. For example, via, pad and/or trace may be formed. A plating process may be used to form the interconnects.

Stage 8 illustrates a state after another dielectric layer 1124 is formed over the dielectric layer 1122. A deposition and/or lamination process may be used to form the dielectric layer 1124. The dielectric layer 1124 may be the same material as the dielectric layer 1120. However, different implementations may use different materials for the dielectric layer.

Stage 9 illustrates a state after a plurality of cavities 1140 is formed in the dielectric layer 1124. An etching process or laser process may be used to form the cavities 1140.

Stage 10, as shown in FIG. 11C, illustrates a state after interconnects 1116 are formed in and over the dielectric layer 1124, including in and over the plurality of cavities 1140. For example, via, pad and/or trace may be formed. A plating process may be used to form the interconnects.

Some or all of the interconnects 1102, 1112, 1114 and/or 1116 may define a plurality of interconnects 122 of the substrate 102. The dielectric layers 1120, 1122, 1124 may be represented by the at least one dielectric layer 120.

Stage 11 illustrates a state after the carrier 1100 is decoupled (e.g., removed, grinded out) from the dielectric layer 1150, leaving the substrate 102 that includes the at least one dielectric layer 120 and the plurality of interconnects 122.

Stage 12 illustrates a state after the first solder resist layer 1160 and the second solder resist layer 1162 are formed over the substrate 102. A deposition process may be used to form the first solder resist layer 1160 and the second solder resist layer 1162. In some implementations, none or one solder resist layer may be formed over the at least one dielectric layer 1150.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Exemplary Flow Diagram of a Method for Fabricating a Substrate

Figure 12:
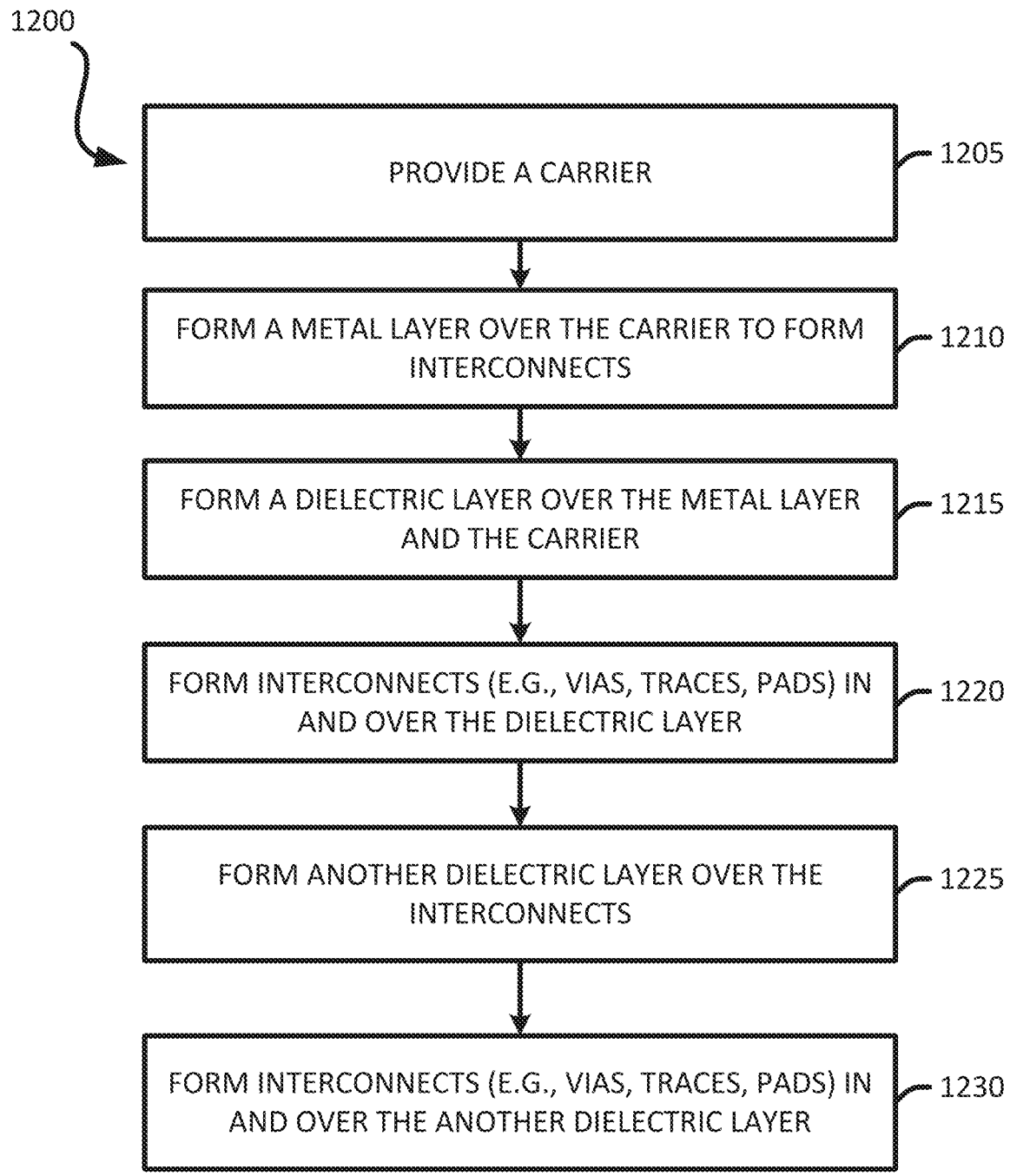
FIG. 12 illustrates an exemplary flow diagram of a method for fabricating a substrate.

In some implementations, fabricating a substrate includes several processes. FIG. 12 illustrates an exemplary flow diagram of a method 1200 for providing or fabricating a substrate. In some implementations, the method 1200 of FIG. 12 may be used to provide or fabricate the substrate(s) of FIGS. 1-4. For example, the method 1200 of FIG. 12 may be used to fabricate the substrate 102.

It should be noted that the method of FIG. 12 may combine one or more processes in order to simplify and/or clarify the method for providing or fabricating a substrate. In some implementations, the order of the processes may be changed or modified.

The method provides (at 1205) a carrier 1100. Different implementations may use different materials for the carrier. The carrier may include a substrate, glass, quartz and/or carrier tape. Stage 1 of FIG. 11A illustrates and describes an example of a carrier that is provided.

The method forms (at 1210) a metal layer over the carrier 1100. The metal layer may be patterned to form interconnects. A plating process may be used to form the metal layer and interconnects. In some implementations, the carrier may include a metal layer. The metal layer over the carrier may be patterned to form interconnects (e.g., 1102). Stage 1 of FIG. 11A illustrates and describes an example of a metal layer and interconnects that are formed over a carrier.

The method forms (at 1215) a dielectric layer 1120 over the carrier 1100 and the interconnects 1102. A deposition and/or lamination process may be used to form the dielectric layer. The dielectric layer 1120 may include polyimide. Forming the dielectric layer may also include forming a plurality of cavities (e.g., 1110) in the dielectric layer 1120. The plurality of cavities may be formed using an etching process (e.g., photo etching) or laser process. Stages 2-3 of FIG. 11A illustrate and describe an example of forming a dielectric layer and cavities in the dielectric layer.

The method forms (at 1220) interconnects in and over the dielectric layer. For example, the interconnects 1112 may be formed in and over the dielectric layer 1120. A plating process may be used to form the interconnects. Forming interconnects may include providing a patterned metal layer over and/or in the dielectric layer. Forming interconnects may also include forming interconnects in cavities of the dielectric layer. Stage 4 of FIG. 11A illustrates and describes an example of forming interconnects in and over a dielectric layer.

The method forms (at 1225) a dielectric layer 1122 over the dielectric layer 1120 and the interconnects. A deposition and/or lamination process may be used to form the dielectric layer. The dielectric layer 1122 may include polyimide. Forming the dielectric layer may also include forming a plurality of cavities (e.g., 1130) in the dielectric layer 1122. The plurality of cavities may be formed using an etching process or laser process. Stages 5-6 of FIGS. 11A-11B illustrate and describe an example of forming a dielectric layer and cavities in the dielectric layer.

The method forms (at 1230) interconnects in and/or over the dielectric layer. For example, the interconnects 1114 may be formed. A plating process may be used to form the interconnects. Forming interconnects may include providing a patterned metal layer over an in the dielectric layer. Forming interconnects may also include forming interconnects in cavities of the dielectric layer. Stage 7 of FIG. 11B illustrates and describes an example of forming interconnects in and over a dielectric layer.

The method may form additional dielectric layer(s) and additional interconnects as described at 1225 and 1230. Stages 8-10 of FIGS. 11B-11C illustrate and describe an example of forming an additional dielectric layer and interconnects in and over a dielectric layer.

Once all the dielectric layer(s) and additional interconnects are formed, the method may decouple (e.g., remove, grind out) the carrier (e.g., 1100) from the dielectric layer 120, leaving the substrate. In some implementations, the method may form solder resist layers (e.g., 1160, 1162) over the substrate.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Exemplary Electronic Devices

Figure 13:
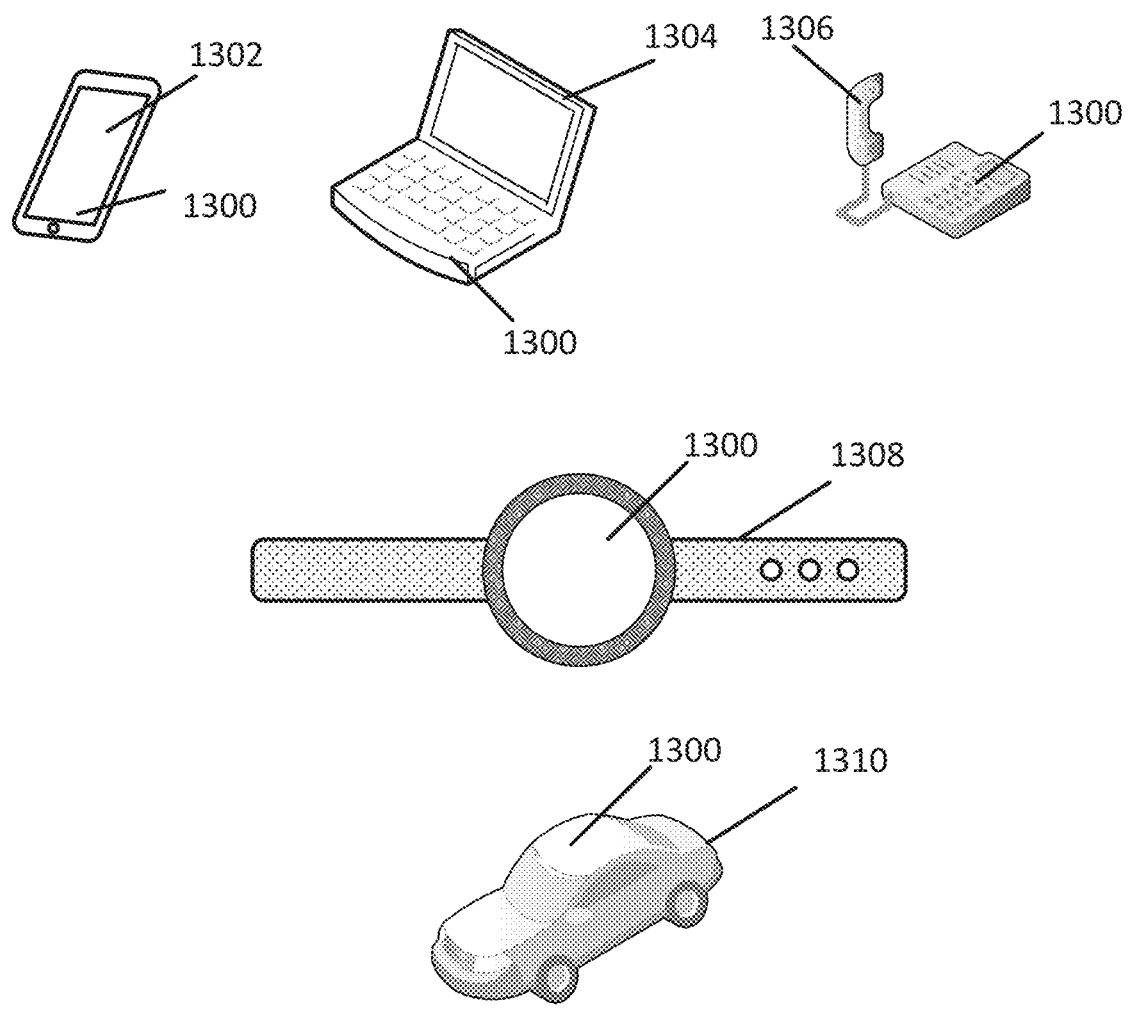
FIG. 13 illustrates various electronic devices that may integrate a die, an electronic circuit, an integrated device, an integrated passive device (IPD), a passive component, a package, and/or a device package described herein.

FIG. 13 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1302, a laptop computer device 1304, a fixed location terminal device 1306, a wearable device 1308, or automotive vehicle 1310 may include a device 1300 as described herein. The device 1300 may be, for example, any of the devices and/or integrated circuit (IC) packages described herein. The devices 1302, 1304, 1306 and 1308 and the vehicle 1310 illustrated in FIG. 13 are merely exemplary. Other electronic devices may also feature the device 1300 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles, or any other device that stores or retrieves data or computer instructions, or any combination thereof.

One or more of the components, processes, features, and/or functions illustrated in FIGS. 1-6, 9A-9C, 10, 11A-11C and/or 12-13 may be rearranged and/or combined into a single component, process, feature or function or embodied in several components, processes, or functions. Additional elements, components, processes, and/or functions may also be added without departing from the disclosure. It should also be noted FIGS. 1-6, 9A-9C, 10, 11A-11C and/or 12-13 and its corresponding description in the present disclosure is not limited to dies and/or ICs. In some implementations, FIGS. 1-6, 9A-9C, 10, 11A-11C and/or 12-13 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. Coupling a component A to a component B may mean that a component A is coupled to a component B, and/or a component B is coupled to a component A. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/ or components. In some implementations, an interconnect may include a trace, a via, a pad, a pillar, a redistribution metal layer, and/or an under bump metallization (UBM) layer. An interconnect may include one or more metal components (e.g., seed layer+metal layer). In some implementations, an interconnect is an electrically conductive material that may be configured to provide an electrical path for a signal (e.g., a data signal, ground or power). An interconnect may be part of a circuit. An interconnect may include more than one element or component. An interconnect may be defined by one or more interconnects. Different implementations may use similar or different processes to form the interconnects. In some implementations, a chemical vapor deposition (CVD) process and/or a physical vapor deposition (PVD) process for forming the interconnects. For example, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The following provides an overview of aspects of the present disclosure:

Aspect 1: A package comprising: a substrate; a first integrated device coupled to the substrate; a second integrated device coupled to the substrate; a first bridge coupled to the first integrated device and the second integrated device, wherein the first bridge is configured to provide at least one first electrical path between the first integrated device and the second integrated device, and wherein the first bridge is coupled to a top portion of the first integrated device and a top portion of the second integrated device; and a second bridge coupled to the first integrated device and the second integrated device, wherein the second bridge is configured to provide at least one second electrical path between the first integrated device and the second integrated device.

Aspect 2: The package of aspect 1, wherein the at least one first electrical path includes a back side of the first integrated device and a back side of the second integrated device.

Aspect 3: The package of aspects 1 through 2, wherein the first integrated device comprises: a first die; and a second die coupled to the first die.

Aspect 4: The package of aspect 3, wherein the second integrated device comprises: a third die; and a fourth die coupled to the third die.

Aspect 5: The package of aspect 4, wherein the first die is located over the second die, wherein the second die is coupled to the substrate, wherein the third die is located over the fourth die, and wherein the fourth die is coupled to the substrate.

Aspect 6: The package of aspects 4 through 5, wherein the first die is configured to be electrically coupled to the third die through the first bridge.

Aspect 7: The package of aspects 4 through 6, wherein the first integrated device includes a first encapsulation layer, and wherein the second integrated device includes a second encapsulation layer.

Aspect 8: The package of aspects 3 through 7, wherein a front side of the first die faces a front side of the second die.

Aspect 9: The package of aspects 3 through 7, wherein a front side of the first die faces a back side of the second die.

Aspect 10: The package of aspects 3 through 7, wherein a back side of the first die faces a front side of the second die.

Aspect 11: The package of aspects 1 through 10, wherein the first bridge includes a bridge die comprising: a die substrate; and at least one bridge interconnect.

Aspect 12: The package of aspects 1 through 10, wherein the first bridge includes a bridge structure comprising: at least one dielectric layer; and at least one bridge interconnect.

Aspect 13: The package of aspects 1 through 12, wherein the first bridge is configured to provide at least one first electrical path for input/output (I/O) signals between the first integrated device and the second integrated device.

Aspect 14: The package of aspects 1 through 13, wherein the second bridge is configured to provide at least one second electrical path for input/output (I/O) signals between the first integrated device and the second integrated device.

Aspect 15: The package of aspects 1 through 2, wherein the first integrated device comprises: a first die; and a second die coupled to the first die, wherein the second integrated device comprises: a third die; and a fourth die coupled to the third die, and wherein the first bridge is configured to provide at least one first electrical path for input/output (I/O) signals between the first die and the third die, and wherein the second bridge is configured to provide at least one second electrical path for input/output (I/O) signals between the second die and the fourth die.

Aspect 16: The package of aspects 1 through 15, wherein the second bridge is located at least partially in the substrate.

Aspect 17: An apparatus comprising: a substrate; a first integrated device coupled to the substrate; a second integrated device coupled to the substrate; means for a first bridge interconnection coupled to the first integrated device and the second integrated device, wherein the means for a first bridge interconnection is configured to provide at least one first electrical path between the first integrated device and the second integrated device, and wherein the means for a first bridge interconnection is coupled to a top portion of the first integrated device and a top portion of the second integrated device; and means for a second bridge interconnection coupled to the first integrated device and the second integrated device, wherein the means for a second bridge interconnection is configured to provide at least one second electrical path between the first integrated device and the second integrated device.

Aspect 18: The apparatus of aspect 17, wherein the first integrated device comprises: a first die; and a second die coupled to the first die.

Aspect 19: The apparatus of aspect 18, wherein the second integrated device comprises: a third die; and a fourth die coupled to the third die.

Aspect 20: The apparatus of aspects 18 through 19, wherein a front side of the first die faces a front side of the second die.

Aspect 21: The apparatus of aspects 18 through 19, wherein a front side of the first die faces a back side of the second die.

Aspect 22: The apparatus of aspects 18 through 19, wherein a back side of the first die faces a front side of the second die.

Aspect 23: The apparatus of aspects 17 through 22, wherein the means for a first bridge interconnection includes a bridge die comprising: a die substrate; and at least one bridge interconnect.

Aspect 24: The apparatus of aspects 17 through 22, wherein the means for a first bridge interconnection includes a bridge structure comprising: at least one dielectric layer; and at least one bridge interconnect.

Aspect 25: The apparatus of aspects 17 through 24, wherein the apparatus includes an electronic device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect 26: A method for fabricating a package, comprising: providing a substrate; coupling a first integrated device to the substrate; coupling a second integrated device to the substrate; coupling a first bridge to the first integrated device and the second integrated device, wherein the first bridge is configured to provide at least one first electrical path between the first integrated device and the second integrated device, and wherein the first bridge is coupled to a top portion of the first integrated device and a top portion of the second integrated device; and coupling a second bridge to the first integrated device and the second integrated device, wherein the second bridge is configured to provide at least one second electrical path between the first integrated device and the second integrated device.

Aspect 27: The method of aspect 26, wherein coupling the second bridge to the first integrated device and the second integrated device, is performed when the first integrated device and the second integrated device are coupled to the substrate.

Aspect 28: The method of aspects 26 through 27, wherein the at least one first electrical path includes a back side of the first integrated device and a back side of the second integrated device.

Aspect 29: The method of aspects 26 through 28, wherein the first integrated device comprises: a first die; a second die coupled to the first die; a third die; and a fourth die coupled to the third die.

Aspect 30: The method of aspect 29, wherein the first die is configured to be electrically coupled to the third die through the first bridge.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A package comprising:
a first substrate comprising at least one dielectric layer;
a first integrated device coupled to the first substrate through at least a first plurality of pillar interconnects and a first plurality of solder interconnects;
a second integrated device coupled to the first substrate through at least a second plurality of pillar interconnects and a second plurality of solder interconnects;
a first bridge coupled to the first integrated device and the second integrated device through at least a third plurality of solder interconnects,
wherein the first bridge is configured to provide at least one first electrical path between the first integrated device and the second integrated device, and
wherein the first bridge is coupled to a top portion of the first integrated device and a top portion of the second integrated device, through at least the third plurality of solder interconnects; and
a second bridge coupled to the first integrated device and the second integrated device through a fourth plurality of solder interconnects,
wherein the second bridge is configured to provide at least one second electrical path between the first integrated device and the second integrated device,
wherein the second bridge comprises:
a silicon substrate comprising silicon;
a plurality of bridge interconnects;
a passivation layer coupled to the silicon substrate, wherein the passivation layer is a different material from the at least one dielectric layer of the first substrate;
wherein the fourth plurality of solder interconnects directly touches the plurality of bridge interconnects of the second bridge,
wherein the second bridge is embedded in the first substrate such that there is no dielectric layer from the first substrate that is located vertically between the passivation layer of the second bridge and the first integrated device, and
wherein a side portion of the passivation layer of the second bridge touches the first substrate.

2. The package of claim 1, wherein the at least one first electrical path includes a back side of the first integrated device and a back side of the second integrated device.

3. The package of claim 1, wherein the first integrated device comprises:
a first die; and
a second die coupled to the first die.

4. The package of claim 3, wherein the second integrated device comprises:
a third die; and
a fourth die coupled to the third die.

5. The package of claim 4,
wherein the first die is located over the second die,
wherein the second die is coupled to the first substrate,
wherein the third die is located over the fourth die, and
wherein the fourth die is coupled to the first substrate.

6. The package of claim 4, wherein the first die is configured to be electrically coupled to the third die through the first bridge.

7. The package of claim 4,
wherein the first integrated device includes a first encapsulation layer, and
wherein the second integrated device includes a second encapsulation layer.

8. The package of claim 3, wherein a front side of the first die faces a front side of the second die.

9. The package of claim 3, wherein a front side of the first die faces a back side of the second die.

10. The package of claim 3, wherein a back side of the first die faces a front side of the second die.

11. The package of claim 1, wherein the first bridge includes a bridge die comprising:
a first silicon substrate; and
at least one bridge interconnect.

12. The package of claim 1, wherein the first bridge includes a bridge structure comprising:
at least one dielectric layer; and
at least one bridge interconnect.

13. The package of claim 1,
wherein the first bridge is configured to provide at least one first electrical path for input/output (I/O) signals between the first integrated device and the second integrated device, and
wherein the second bridge is configured to provide at least one second electrical path for input/output (I/O) signals between the first integrated device and the second integrated device.

14. The package of claim 1,
wherein the first integrated device is coupled to the second bridge through at least a third plurality of pillar interconnects and solder interconnects from the fourth plurality of solder interconnects, and
wherein the second integrated device is coupled to the second bridge through at least a fourth plurality of pillar interconnects and other solder interconnects from the fourth plurality of solder interconnects.

15. The package of claim 1, wherein the first bridge is coupled to the first integrated device and the second integrated device through at least a third plurality of pillar interconnects and the third plurality of solder interconnects.

16. The package of claim 1, wherein the second bridge is located at least partially in the first substrate.

17. A package comprising:
a first substrate comprising at least one dielectric layer;
a first stack of dies comprising:
 a first die; and
 a second die coupled to the first die through at least a first plurality of solder interconnects, wherein the second die is coupled to the first substrate through at least a first plurality of pillar interconnects and a second plurality of solder interconnects;
a second stack of dies comprising:
 a third die; and
 a fourth die coupled to the third die through at least a third plurality of solder interconnects, wherein the fourth die is coupled to the first substrate through at least a second plurality of pillar interconnects and a fourth plurality of solder interconnects;
a first bridge coupled to the first stack of dies and the second stack of dies through at least a fifth plurality of solder interconnects,
 wherein the first bridge is configured to provide at least one first electrical path between the first stack of dies and the second stack of dies, and
 wherein the first bridge is coupled to a top portion of the first stack of dies and a top portion of the second stack of dies, through at least the fifth plurality of solder interconnects; and
a second bridge coupled to the first stack of dies and the second stack of dies through a sixth plurality of solder interconnects,
 wherein the second bridge is configured to provide at least one second electrical path between the first stack of dies and the second stack of dies,
 wherein the second bridge comprises:
  a silicon substrate comprising silicon;
  a plurality of bridge interconnects;
  a passivation layer coupled to the silicon substrate, wherein the passivation layer is a different material from the at least one dielectric layer of the first substrate;
 wherein the sixth plurality of solder interconnects directly touches the plurality of bridge interconnects of the second bridge,
 wherein the second bridge is embedded in the first substrate such that there is no dielectric layer from the first substrate that is located vertically between the passivation layer of the second bridge and the first stack of dies, and
 wherein a side portion of the passivation layer of the second bridge touches the first substrate.

18. The package of claim 17, wherein a front side of the first die faces a front side of the second die.

19. The package of claim 17, wherein a front side of the first die faces a back side of the second die.

20. The package of claim 17, wherein a back side of the first die faces a front side of the second die.

21. The package of claim 17, wherein the first bridge includes a bridge die comprising:
a first silicon substrate; and
at least one bridge interconnect.

22. The package of claim 17, wherein the first bridge includes a bridge structure comprising:
at least one dielectric layer; and
at least one bridge interconnect.

23. The package of claim 17, wherein the second bridge is located at least partially in the first substrate.

24. The package of claim 17, wherein the first bridge is coupled to the first die and the third die through at least the fifth plurality of solder interconnects.

25. The package of claim 24, wherein the second bridge is coupled to the first second and the fourth die through at least the sixth plurality of solder interconnects.

\* \* \* \* \*